US011355546B2

(12) United States Patent
Ito (10) Patent No.: US 11,355,546 B2
(45) Date of Patent: Jun. 7, 2022

(54) SOLID-STATE IMAGING ELEMENT AND ELECTRONIC DEVICE

(71) Applicant: SONY CORPORATION, Tokyo (JP)

(72) Inventor: Kyosuke Ito, Kanagawa (JP)

(73) Assignee: SOW CORPORATION, Tokyo (JP)

( * ) Notice: Subject to any disclaimer, the term of this patent is extended or adjusted under 35 U.S.C. 154(b) by 0 days.

(21) Appl. No.: 16/987,243

(22) Filed: Aug. 6, 2020

(65) Prior Publication Data

US 2021/0020684 A1 Jan. 21, 2021

Related U.S. Application Data

(62) Division of application No. 16/086,670, filed as application No. PCT/JP2017/010847 on Mar. 17, 2017, now Pat. No. 10,770,503.

(30) Foreign Application Priority Data

Mar. 31, 2016 (JP) .................................. 2016-070060

(51) Int. Cl.
  *H01L 27/146* (2006.01)
  *H04N 21/426* (2011.01)
  *H04N 1/00* (2006.01)

(52) U.S. Cl.
  CPC .... *H01L 27/14645* (2013.01); *H01L 27/1461* (2013.01); *H01L 27/1464* (2013.01);
  (Continued)

(58) Field of Classification Search
  CPC ......... H01L 27/14645; H01L 27/42692; H01L 27/14614; H01L 27/14638; H01L 27/1464;
  (Continued)

(56) References Cited

U.S. PATENT DOCUMENTS

2010/0117126 A1* 5/2010 Takahashi ......... H01L 27/14652
  257/292
2011/0019063 A1* 1/2011 Watanabe ......... H01L 27/14689
  348/340
(Continued)

FOREIGN PATENT DOCUMENTS

JP   2010-114323   5/2010
JP   2011-029337   2/2011
(Continued)

OTHER PUBLICATIONS

Notice of Allowance (with English translation) for Japan Patent Application No. 2016-070060, dated Dec. 7, 2021, 6 pages.

*Primary Examiner* — Galina G Yushina
(74) *Attorney, Agent, or Firm* — Sheridan Ross P.C.

(57) ABSTRACT

An imaging device and an electronic apparatus including an imaging device are provided. The imaging device includes a substrate and plurality of pixel regions, wherein each pixel region includes: a first photoelectric conversion portion that performs photoelectric conversion according to a first wavelength of incident light; a first reading portion that reads charges converted by the first photoelectric conversion portion; a first storage unit that is formed between adjacent pixels and stores the charges read by the first reading portion; a second photoelectric conversion portion that performs photoelectric conversion according to a second wavelength different from the first wavelength; a second reading portion that reads charges converted by the second photoelectric conversion portion; and a second storage unit that is formed between adjacent pixels and stores the charges read by the second reading portion.

19 Claims, 10 Drawing Sheets

(52) U.S. Cl.
CPC .. *H01L 27/14614* (2013.01); *H01L 27/14638* (2013.01); *H01L 27/14641* (2013.01); *H01L 27/14667* (2013.01); *H04N 1/0009* (2013.01); *H04N 21/42692* (2013.01)

(58) Field of Classification Search
CPC ......... H01L 27/14641; H01L 27/14603; H01L 27/14612; H01L 27/14636; H01L 27/14643
See application file for complete search history.

(56) References Cited

U.S. PATENT DOCUMENTS

| | | | |
|---|---|---|---|
| 2011/0073923 A1* | 3/2011 | Tatani | ............... H01L 27/14641 257/291 |
| 2013/0049082 A1* | 2/2013 | Kato | ................. H01L 27/14641 257/292 |
| 2013/0307040 A1* | 11/2013 | Ahn | ................... H01L 27/1463 257/292 |

FOREIGN PATENT DOCUMENTS

| JP | 2012-084610 | 4/2012 |
|---|---|---|
| JP | 2013-038118 | 2/2013 |
| KR | 10-2011-0011542 | 2/2011 |
| KR | 10-2014-0083975 | 7/2014 |

\* cited by examiner

SOLID-STATE IMAGING ELEMENT AND ELECTRONIC DEVICE

CROSS REFERENCE TO RELATED APPLICATIONS

This application is a divisional application of U.S. application Ser. No. 16/086,670 filed Sep. 20, 2018, which is a national stage application under 35 U.S.C. 371 and claims the benefit of PCT Application No. PCT/JP2017/010847 having an international filing date of Mar. 17, 2017, which designated the United States, which PCT application, which claims the benefit of Japanese Priority Patent Application JP 2016-070060 filed Mar. 31, 2016, the entire contents of each of which are incorporated herein by reference. This application is related to a U.S. Divisional patent application being filed simultaneously herewith Ser. No. 16/987,239.

TECHNICAL FIELD

The present disclosure relates to a solid-state imaging element and an electronic device, in particular, relates to a solid-state imaging element of a vertical spectral type capable of generating respective color signals of red (R), green (G), and blue (B) from one pixel region, and to an electronic device.

BACKGROUND ART

Such a solid-state imaging element of a vertical spectral type is proposed to be capable of generating a plurality of color signals from one pixel region by laminating a plurality of photoelectric conversion portions (photodiodes (PDs), etc.) in a depth direction of a substrate.

The solid-state imaging element of the vertical spectral type has merits, for example, that a fake color is not easily generated because de-mosaic processing is not necessary and light utilization efficiency is higher than that of a solid-state imaging element in related art that generates a color signal of one of R, G, and B from one pixel region.

Hitherto, there is a technology for sharing a floating diffusion (FD) for realizing fine processing of a pixel with a plurality of pixels in the solid-state imaging element, and a configuration for sharing the FD with a plurality of pixels is proposed also to the solid-state imaging element of the vertical spectral type (for example, see PTL 1).

Figure 1:
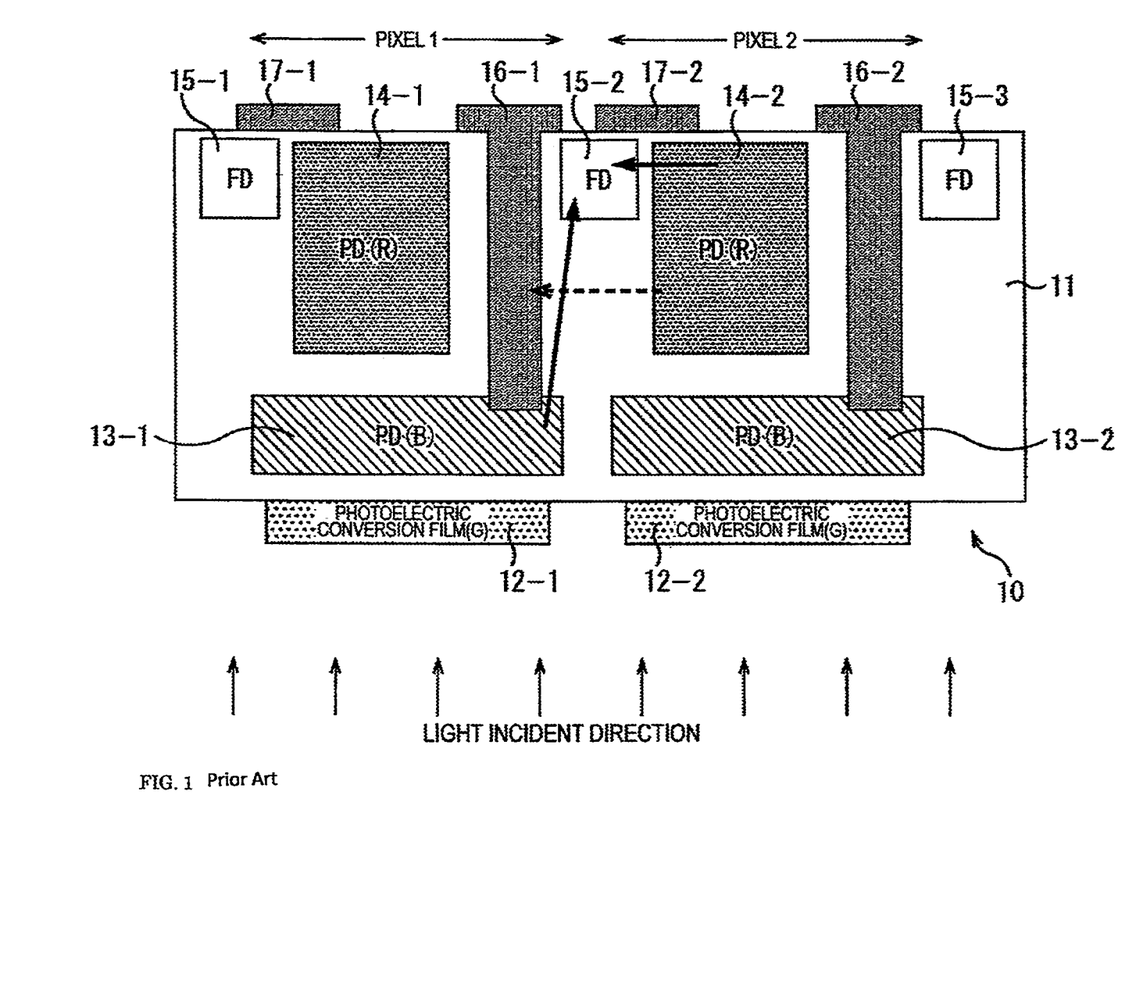
FIG. 1 is a cross-sectional view showing an example of a configuration of a solid-state imaging element of a vertical spectral type in related art.

FIG. 1 shows an example of a configuration of the solid-state imaging element of the vertical spectral type sharing the FD with a plurality of pixels.

A solid-state imaging element 10 is a rear-surface irradiation type that light is incident from a rear-surface side (lower side in the diagram). A photoelectric conversion film (G) 12-1, which performs photoelectric conversion according to a wavelength of a G component of incident light, is formed in a pixel 1 of the solid-state imaging element 10 on the outside of a rear-surface of a Si substrate 11. APD (B) 13-1 that performs photoelectric conversion according to a wavelength of a B component of the incident light and a PD (R) 14-1 that performs photoelectric conversion according to a wavelength of an R component of the incident light are laminated in order from the rear-surface side thereof in the Si substrate 11.

A vertical transistor (Tr) 16-1 is connected to the PD (B) 13-1. A planar Tr 17-1 is formed on a front-surface side (top side in the diagram) of the PD (R) 14-1.

Similarly, in a pixel 2, a photoelectric conversion film (G) 12-2 is formed on the outside of the rear surface of the Si substrate 11. A PD (B) 13-2 and a PD (R) 14-2 are laminated in order from the rear-surface side thereof in the Si substrate 11.

A vertical Tr 16-2 is connected to the PD 13-2. A planar Tr 17-2 is formed on a front-surface side of the PD (R) 14-2.

Further, an FD 15 is formed between the pixels. For example, an FD 15-2 is formed between the pixels 1 and 2.

In the pixel 1 of the solid-state imaging element 10, charges photoelectrically converted by the PD (B) 13-1 are transmitted and stored in the FD 15-2 via the vertical Tr 16-1, as shown by a solid arrow. Further charges photoelectrically converted by the PD (R) 14-1 are transmitted and stored in the FD 15-1 via the planar Tr 17-1.

Moreover, in the pixel 2, charges photoelectrically converted by the PD 13-2 (B) are transmitted and stored in an FD 15-3 via the vertical Tr 16-2. Further, charges photoelectrically converted by the PD (R) 14-2 are transmitted and stored in the FD 15-2 via the planar Tr 17-2.

That is, in the solid-state imaging element 10, the PD (B) 13-1 and the PD (R) 14-2 which are formed in different depths of the Si substrate 11 in the adjacent pixels 1 and 2 and have different wavelengths of light for photoelectric conversion, respectively, are configured to share the FD 15-2.

CITATION LIST

Patent Literature

PTL 1: JP 2010-114323A

SUMMARY OF INVENTION

Technical Problem

In the configuration of the solid-state imaging element 10 shown in FIG. 1, a transfer region of the vertical Tr 16 is adjacent to a transfer region of the planar Tr 17. Therefore, simultaneous individual optimization is difficult and it is disadvantageous for fine processing. Further, when the vertical Tr 16-1 is turned on in a state in which charges are stored in the PD (R) 14-2, as shown by a broken arrow in the diagram, short-circuit of charges may be generated which indicates an event for erroneously reading the charges in the PD (R) 14-2 by the vertical Tr 16-1, and thereby color mixture may occur.

Further, the PD (B) 13 and the PD (R) 14 with different wavelengths of light for photoelectric conversion share the FD 15. Therefore, the conversion efficiency for every color is not optimized. Since the PD (B) 13 and the PD (R) 14 with different wavelengths of light for photoelectric conversion share the FD 15, an amplifier Tr (not shown) at the post stage of the FD 15 is not individually optimized for the PD (B) 13 and the PD (R) 14.

The present disclosure is devised in consideration of these and other problems, and it is possible to realize the fine processing of pixels and the optimization of the conversion efficiency and the amplifier Tr.

Solution to Problem

According to embodiments of the present disclosure, there is provided an imaging device including a substrate and a third photoelectric conversion film disposed above the substrate. A first pixel includes a first region of a first photoelectric conversion film, a first region of a second photoelectric conversion film, the first and second photoelectric conversion films formed in the substrate, and a first vertical transistor connected to the first region of the first photoelectric conversion film. A second pixel includes a second region of the first photoelectric conversion film, a second region of the second photoelectric conversion film, the first and second photoelectric conversion films formed in the substrate, and a second vertical transistor connected to the second region of the first photoelectric conversion film. The imaging device also includes a first floating diffusion. The first floating diffusion stores charges from the first and second regions of the first photoelectric conversion film of the first and second pixels. A portion of each region of the first photoelectric conversion film of the respective pixels is between a light incident surface of the substrate and the vertical transistor for the respective pixel.

According to further embodiments of the present disclosure, there is provided an electronic apparatus that includes an imaging device and a controller that controls operation of the imaging device. The imaging device includes a substrate and a third photoelectric conversion film disposed above the substrate. A first pixel includes a first region of a first photoelectric conversion film, a first region of a second photoelectric conversion film, the first and second photoelectric conversion films formed in the substrate, and a first vertical transistor connected to the first region of the first photoelectric conversion film. A second pixel includes a second region of the first photoelectric conversion film, a second region of the second photoelectric conversion film, the first and second photoelectric conversion films formed in the substrate, and a second vertical transistor connected to the second region of the first photoelectric conversion film. The imaging device also includes a first floating diffusion. The first floating diffusion stores charges from the first and second regions of the first photoelectric conversion film of the first and second pixels. A portion of the each region of the first photoelectric conversion film of the respective pixels is between a light incident surface of the substrate and the vertical transistor for the respective pixel.

Advantageous Effects of Invention

According to embodiments of the present disclosure, it is possible to realize the fine processing of pixels and the optimization of the conversion efficiency and the amplifier Tr.

DESCRIPTION OF EMBODIMENTS

Hereinbelow, a specific description is given of best modes (hereinbelow, referred to as embodiments) for embodying the present disclosure.

First Embodiment

A description is given of a first configuration example (first embodiment) of a solid-state imaging element to which the present disclosure is applied with reference to FIGS. 2 to 5.

Figure 2:
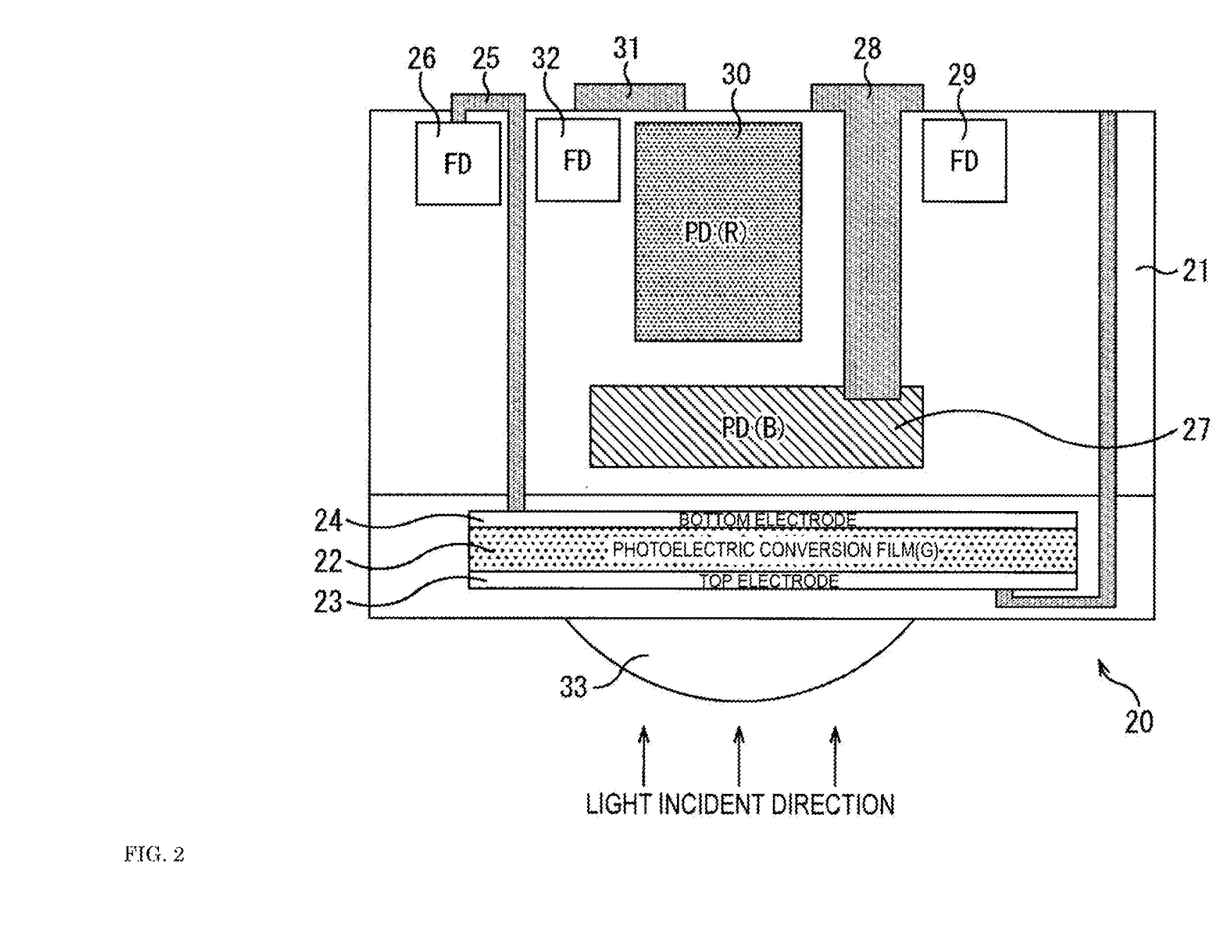
FIG. 2 is a block diagram showing a first configuration example of a solid-state imaging element to which the present disclosure is applied.

FIG. 2 is a block diagram showing a configuration example of one pixel of a solid-state imaging element 20 according to the first embodiment. However, FIG. 2 does not show a predetermined cross-section of the solid-state imaging element 20.

Figure 3:
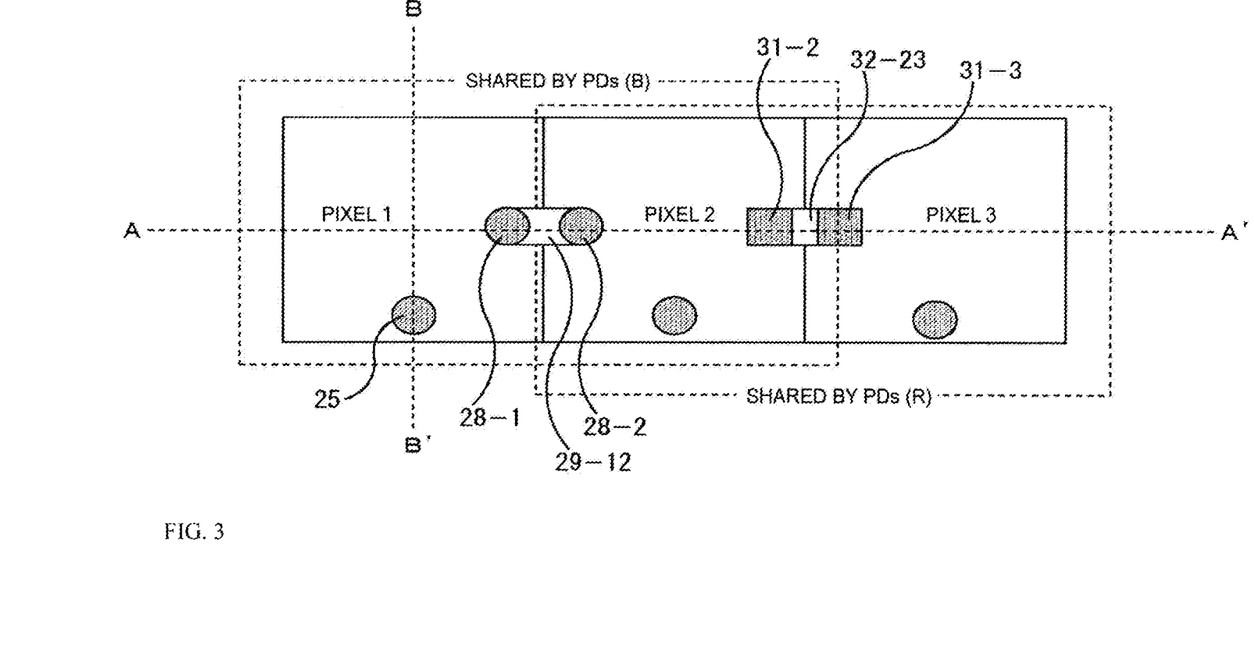
FIG. 3 is a plan view showing a configuration example of the solid-state imaging element shown in FIG. 2.
Figure 4:
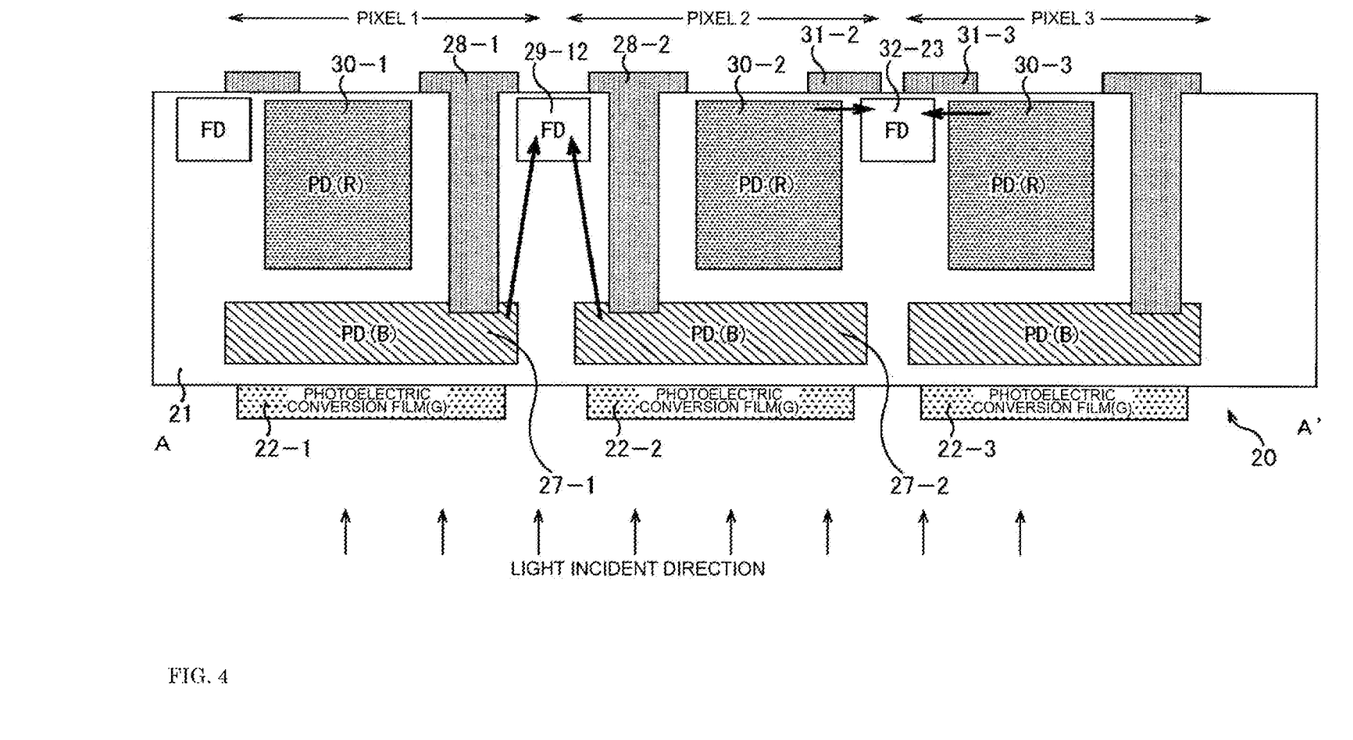
FIG. 4 is a cross-sectional view showing a configuration example of the solid-state imaging element shown in FIG. 2.
Figure 5:
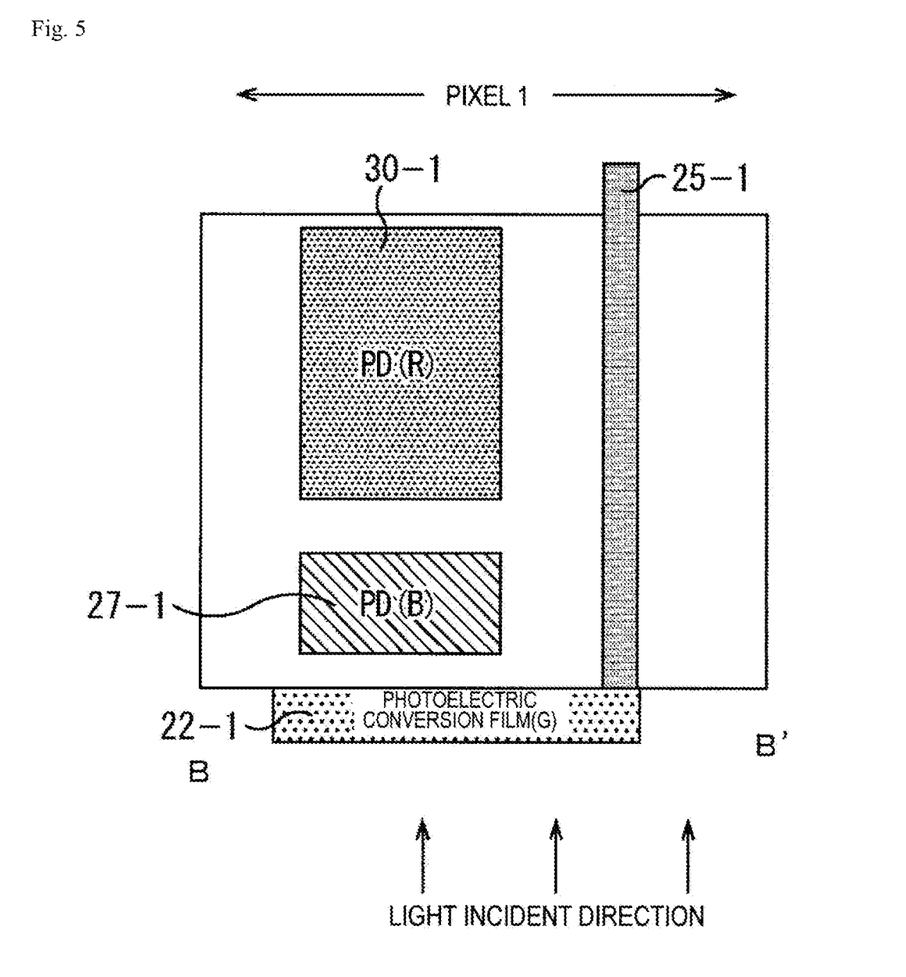
FIG. 5 is a cross-sectional view showing a configuration example of the solid-state imaging element shown in FIG. 2.

FIG. 3 is a plan view of three pixels adjacent in the horizontal direction of the solid-state imaging element 20. FIG. 4 is a cross-sectional view along a line segment AA' in FIG. 3. FIG. 5 is a cross-sectional view along a line segment BB' in FIG. 3.

The solid-state imaging element 20 is configured such that two adjacent pixels share an FD.

A photoelectric conversion film (G) 22 having sensitivity to a G component of incident light is formed on the outside of a rear-surface of the Si substrate 21 in each pixel of the solid-state imaging element 20, a photoelectric conversion region that, for example, includes a photoelectric conversion element or a PD (B) 27 with sensitivity to a B component of the incident light and a photoelectric conversion region that, for example, includes a photoelectric conversion element or a PD (R) 30 with sensitivity to an R component of the incident light are laminated in order from the rear-surface side in the Si substrate 11. An on-chip lens 33 is formed on a rear-surface side (bottom side in the diagram) of the photoelectric conversion film (G) 22.

Hereinbelow, the photoelectric conversion film (G) 22 in the pixel 1 is, for example, referred to as the photoelectric conversion film (G) 22-1. In accordance with at least some embodiments of the present disclosure, the photoelectric conversion film 22 is continuous and extends over a plurality of pixels. Accordingly, each pixel can be associated with a different photoelectric conversion film 22 region that is provided as a discrete section of a photoelectric conversion film, or with a photoelectric conversion film region that is a portion of a photoelectric conversion film that extends over a plurality of pixels. Other components are also similar thereto.

Atop electrode 23 and a bottom electrode 24 are formed on the top and the bottom of the photoelectric conversion film (G) 22 so as to sandwich the photoelectric conversion film (G) 22. A through-electrode 25 is connected to the bottom electrode 24. A vertical Tr 28 is connected to the PD (B) 27. A planar Tr 31 is formed on a front-surface side of the PD (R) 30.

Further, an FD 26 for storing charges from the photoelectric conversion film (G) 22, an FD 29 for storing charges from the PD (B) 27, and an FD 32 for storing charges from the PD (R) 30 are formed between pixels on the front-surface side in the Si substrate 21. The FDs 26, 29, and 32 are shared by two adjacent pixels, respectively. Hereinbelow, the FD 29 formed between the pixels 1 and 2 is, for example, referred to as an FD 29-12. The FDs 26 and 32 are also similar thereto.

For example, as shown in FIG. 4, the FD 29-12 formed between the pixels 1 and 2 is shared by the pixels 1 and 2. Therefore, charges photoelectrically converted by a PD (B) 27-1 in the pixel 1 are transmitted and stored in the FD 29-12 via a vertical Tr 28-1 in the solid-state imaging element 20, as shown by a solid arrow. Charges photoelectrically converted by a PD (B) 27-2 in the pixel 2 adjacent to the pixel 1 are also transmitted and stored in the FD 29-12 via a vertical Tr 28-2.

Moreover, the FD 32-23 formed between pixels 2 and 3 are, for example, shared by the pixels 2 and 3. Therefore, in the solid-state imaging element 20, charges photoelectrically converted by a PD (R) 30-2 in the pixel 2 are transmitted and stored in an FD 32-23 via a planar Tr 31-2. Charges photoelectrically converted by a PD (R) 30-3 in a pixel 3 adjacent to the pixel 2 are also transmitted and stored in the FD 32-23 via a planar Tr 31-3.

Note that the FD 26 that stores the charges from the photoelectric conversion film (G) 22 is not shared by a plurality of pixels, and is formed for every pixel. However, the FD 26 may be shared by a plurality of pixels.

With the solid-state imaging element 20, a pixel transistor after the FD can be also shared, and the fine processing of the pixel can be thus developed. Further, since a transfer region of the vertical Tr 28 can be separated from a transfer region of the planar Tr 31, the vertical Tr 28 and the planar Tr 31 each can be simultaneously optimized, thereby obtaining an advantage for the fine processing of the pixel. In addition, it is possible to suppress the color mixture caused by the short-circuit of charges from the adjacent pixel, which can be happened with the related configuration.

Furthermore, it is possible to optimize the conversion efficiency and the amplifier transistor for every color by sharing the FD with the PDs (B) 27 and the PDs (R) 30, which are adjacent pixels formed at equal depths in the Si substrate 21 and have an equal wavelength of light for photoelectric conversion.

Second Embodiment

Figure 6:
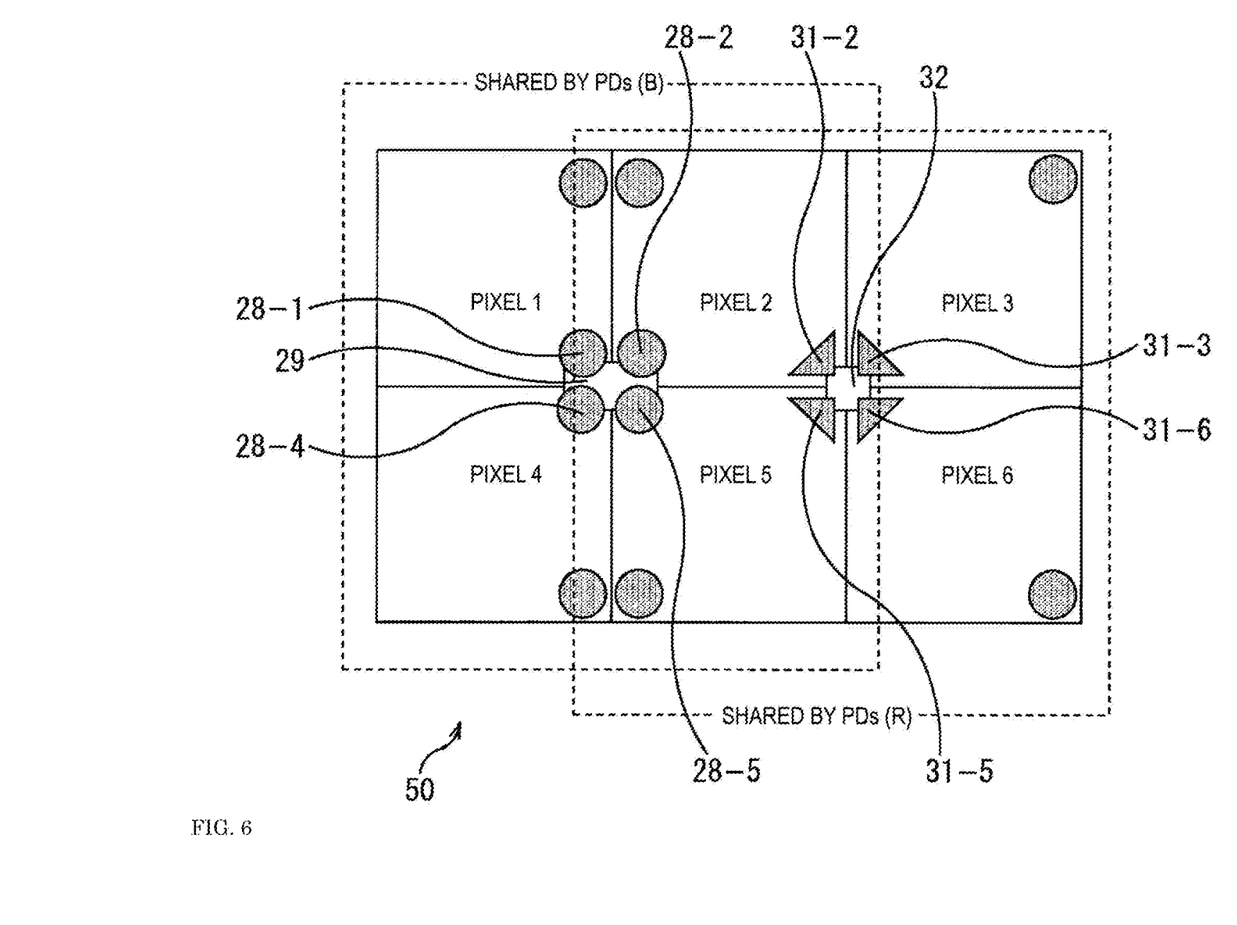
FIG. 6 is a plan view showing a second configuration example of the solid-state imaging element to which the present disclosure is applied.

Next, a description is given of a second configuration example (second embodiment) of a solid-state imaging element to which the present disclosure is applied with reference to FIG. 6.

FIG. 6 is a plan view of six pixels of a solid-state imaging element 50 according to the second embodiment. A configuration example of one pixel of the solid-state imaging element 50 is similar to that of the solid-state imaging element 20 shown in FIG. 2.

The solid-state imaging element 50 is configured such that 2×2 adjacent pixels share the FD.

For example, as shown in FIG. 6, the FD 29 formed between the pixels 1, 2, 4, and 5 is shared by the PDs (B) 27 formed in the pixels 1, 2, 4, and 5 at the same depth, respectively. Further, the FD 32 formed between the pixels 2, 3, 5, and 6 is shared by the PDs (R) 30 formed in the pixels 2, 3, 5, and 6 at the same depth, respectively. FIG. 6 also depicts the locations of through electrodes 25 relative to the respective pixels 1, 2, 3, 4, 5 and 6 in the plan view.

With the solid-state imaging element 50, the same advantages as those of the aforementioned solid-state imaging element 20 are obtained, in addition, the number of pixel transistors is more reduced and the fine processing of pixels is developed.

Third Embodiment

Figure 7:
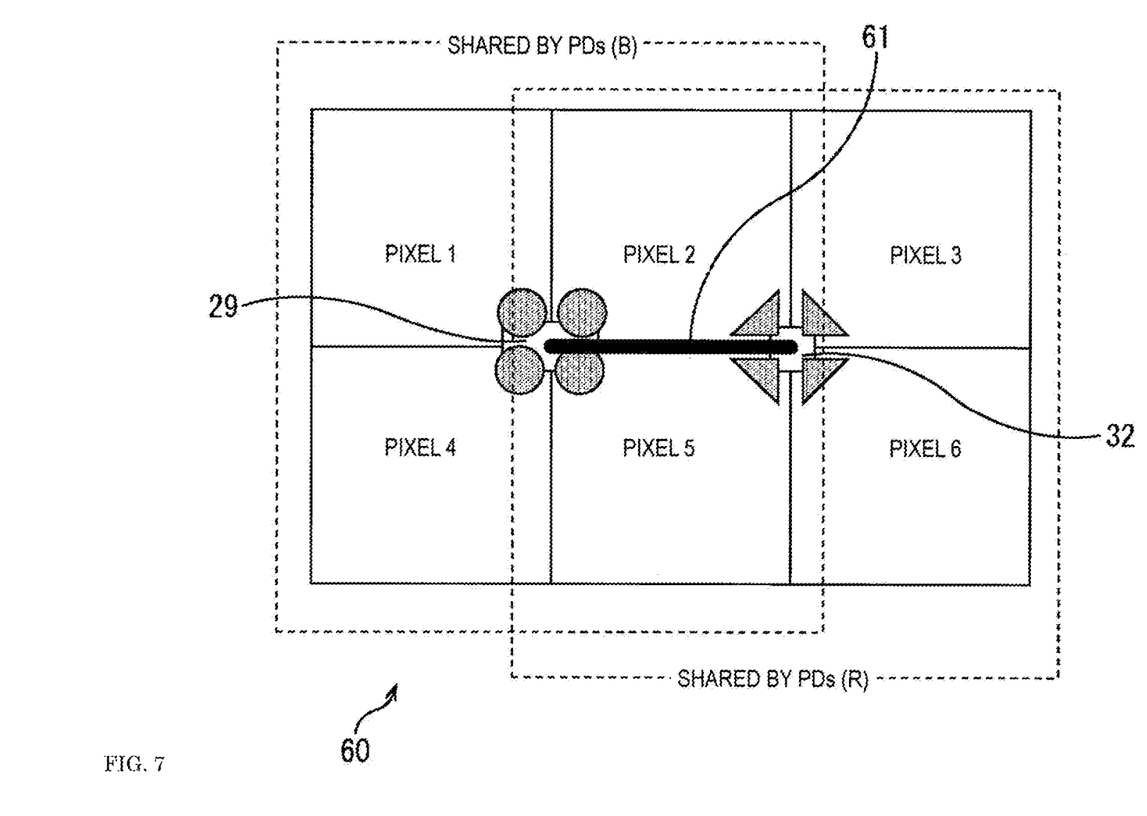
FIG. 7 is a plan view showing a third configuration example of the solid-state imaging element to which the present disclosure is applied.

Next, a description is given of a third configuration example (third embodiment) of a solid-state imaging element to which the present disclosure is applied with reference to FIG. 7.

FIG. 7 is a plan view of six pixels of a solid-state imaging element 60 according to a third embodiment. The solid-state imaging element 60 is formed by adding a wiring 61 for connecting the FD 29 shared by the pixels 1, 2, 4, and 5 and the FD 32 shared by the pixels 2, 3, 5, and 6 to the solid-state imaging element 50 according to the second embodiment shown in FIG. 6 and sharing various transistors (not shown) arranged in the post stages of the FD 29 and the FD 32.

With the solid-state imaging element 60, the pixel transistor after the FD can also be shared. Therefore, the number of pixel transistors can be more reduced than that of the aforementioned solid-state imaging element 50 and the fine processing of the pixel can be further developed.

The transfer region of the vertical Tr 28 is separated from the transfer region of the planar Tr 31, and both thereof can be simultaneously optimized, and it is advantageous for fine processing of the pixels. In addition, it is also possible to suppress the color mixture due to the short-circuit of charges from adjacent pixels that can happen with the related configuration.

Further, in the case of the solid-state imaging element 60, such a configuration is provided that a pixel wiring is the shortest. Therefore, advantageously, the capacity of the FD can be reduced, the conversion efficiency can be improved, another element can be arranged at one side of the pixel, and the like.

<Manufacturing Method of the Solid-State Imaging Element 20 According to First Embodiment>

Figure 8:
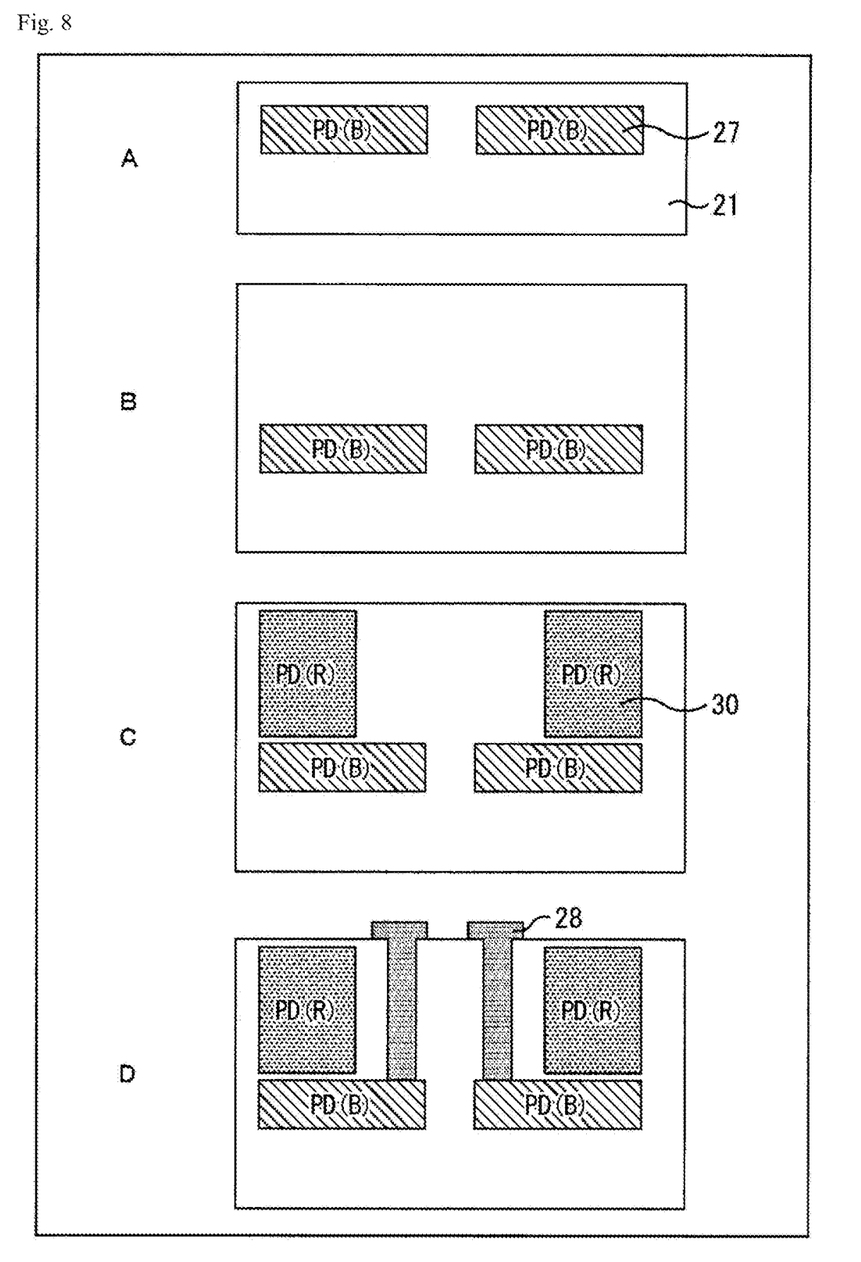
FIG. 8 is a diagram showing a manufacturing process of the solid-state imaging element shown in FIG. 2.
Figure 9:
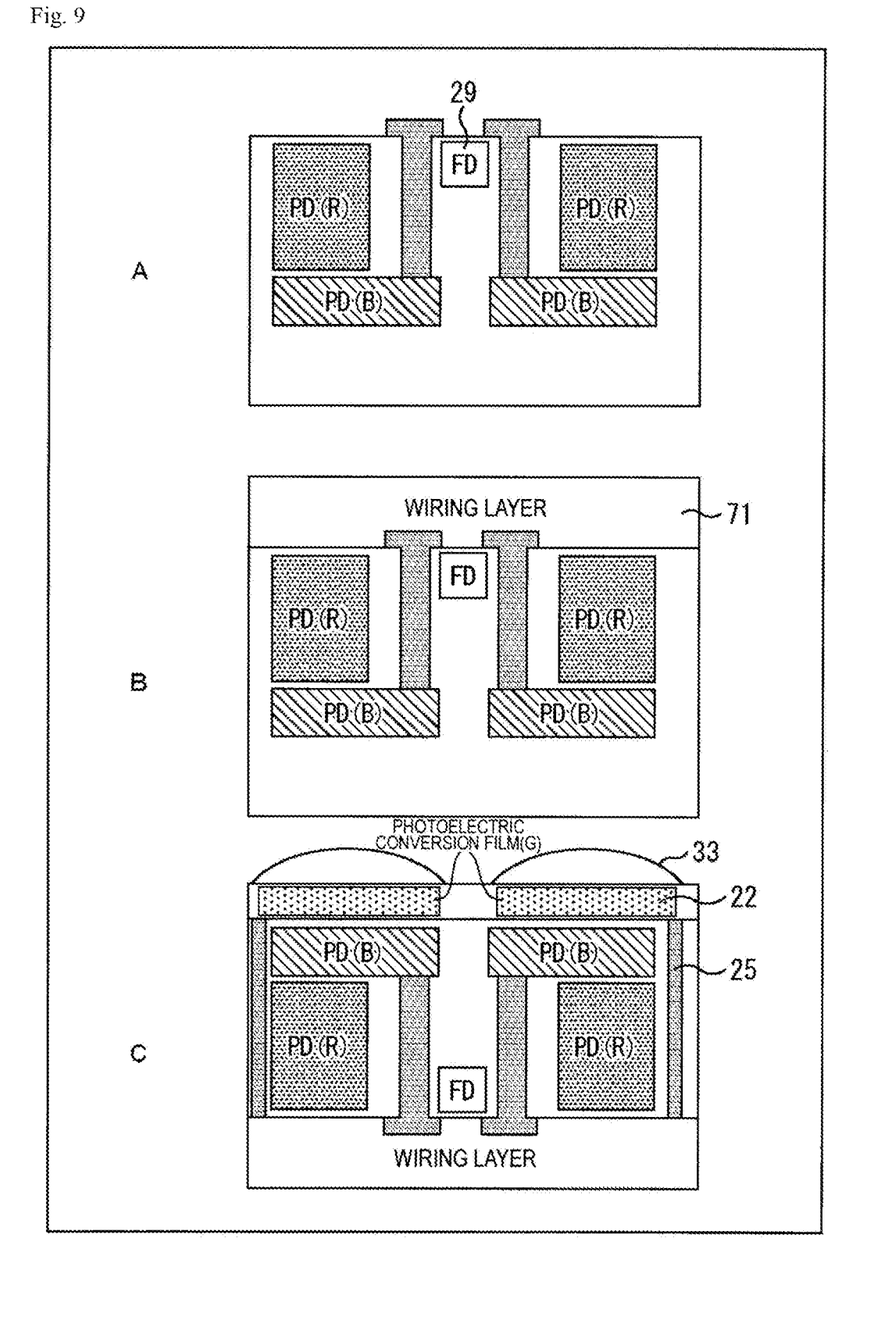
FIG. 9 is a diagram showing a manufacturing process of the solid-state imaging element shown in FIG. 2.

Next, a description is given of a manufacturing method of the solid-state imaging element 20 according to the first embodiment with reference to FIGS. 8 and 9.

FIGS. 8 and 9 show manufacturing processing of the solid-state imaging element 20.

First, as shown in A of FIG. 8, the PD (B) 27 is formed by implanting impurities to the Si substrate 21 with an ion implant (I.I.). As shown in B of FIG. 8, the thickness of the Si substrate 21 is increased with epitaxial growth. As shown in C of FIG. 8, impurities are implanted with I.I., thereby forming the PD (R) 30.

Next, as shown in D of FIG. 8, the vertical Tr 28 and the planar Tr 31 (not shown) are formed. As shown in A of FIG. 9, the FD 26 (not shown), and the FD 29, and the FD 32 (not shown) are formed between the pixels. As shown in B of FIG. 9, a wiring layer 71 is formed on the front-surface side of the Si substrate 21, and the rear-surface side of the Si substrate 21 is polished.

Subsequently, as shown in C of FIG. 9, the through-electrode 25 is formed, and the photoelectric conversion film (G) 22 and the on-chip lens 33 are formed on the outside of the rear-surface of the Si substrate 21.

Note that, since manufacturing methods of the solid-state imaging elements 50 and 60 are similar, a description thereof is omitted.

<Usage Example of Image Sensor>

Figure 10:
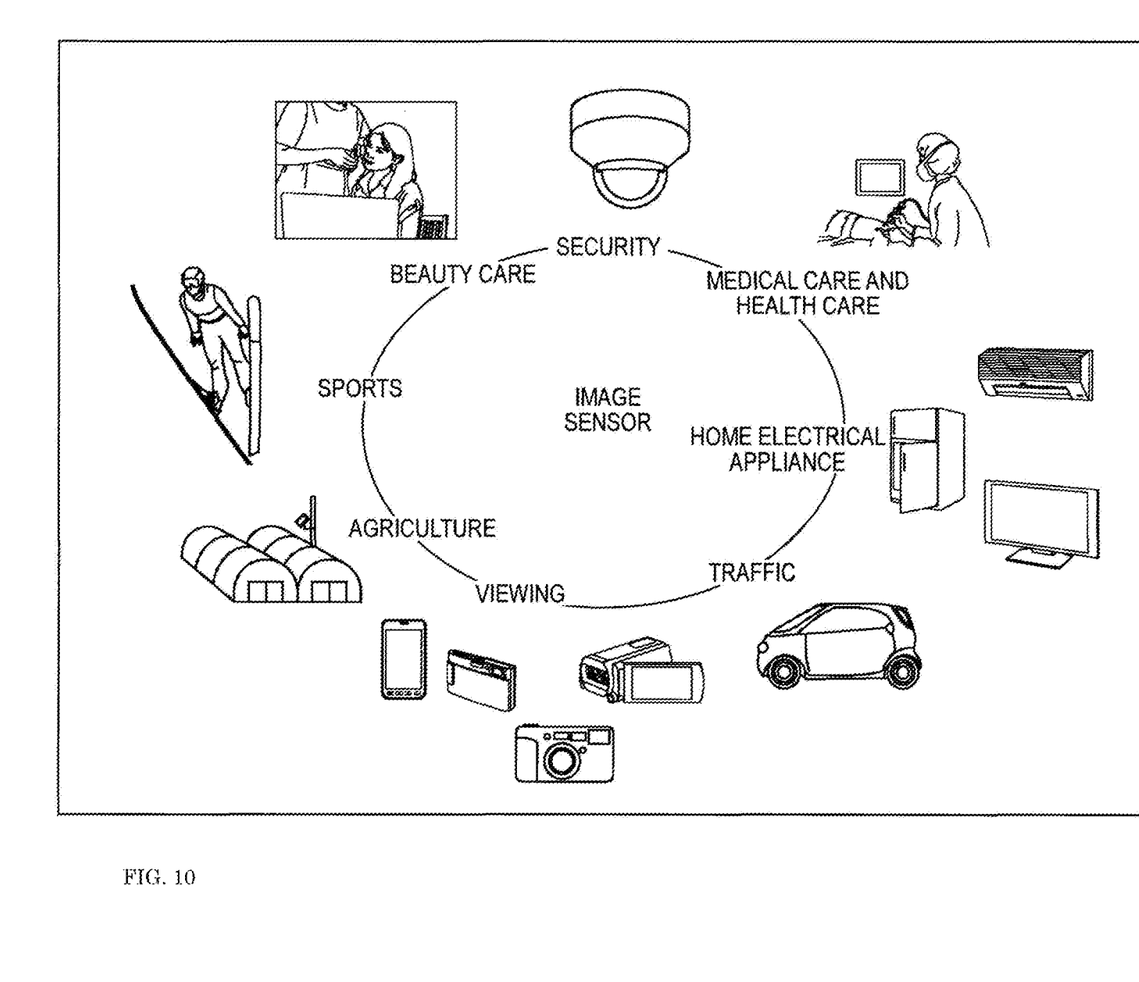
FIG. 10 is a diagram showing a usage example of the solid-state imaging element to which the present disclosure is applied.

FIG. 10 is a diagram showing a usage example of using the aforementioned solid-state imaging elements 20, 50, and 60.

The solid-state imaging elements 20, 50, and 60 can be used in various cases of, e.g., sensing light such as visible light, infrared light, ultraviolet light, and X-ray.

- Devices that take images used for viewing, such as a digital camera and a portable appliance with a camera function.
- Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.
- Devices used for home electrical appliances, such as a TV, a refrigerator, and an air conditioner, to takes images of a gesture of a user and perform appliance operation in accordance with the gesture.
- Devices used for medical care and health care, such as an endoscope and a device that performs angiography by reception of infrared light.
- Devices used for security, such as a monitoring camera for crime prevention and a camera for personal authentication.
- Devices used for beauty care, such as skin measurement equipment that takes images of the skin and a microscope that takes images of the scalp.
- Devices used for sports, such as an action camera and a wearable camera for sports and the like.
- Devices used for agriculture, such as a camera for monitoring the condition of the field and crops.

Additionally, the present technology may be have the following configurations:

(1)

An imaging device comprising a substrate and a third photoelectric conversion film disposed above the substrate. A first pixel includes a first region of a first photoelectric conversion film, a first region of a second photoelectric conversion film, with the first and second photoelectric conversion films being formed in the substrate, and a first vertical transistor connected to the first region of the first photoelectric conversion film. A second pixel includes a second region of the first photoelectric conversion film, and a second region of the second photoelectric conversion film, with the first and second photoelectric conversion films being formed in the substrate, and a second vertical transistor connected to the second region of the first photoelectric conversion film. A first floating diffusion is also included in the imaging device. A portion of the first region of the first photoelectric conversion film of the first pixel is formed between a light incident surface of the substrate and the first vertical transistor of the first pixel, a portion of the second region of the first photoelectric conversion film of the second pixel is formed between the light incident surface of the substrate and the second vertical transistor of the second pixel, and the first floating diffusion stores charges from the first and second regions of the first photoelectric conversion film of the first and second pixels.

(2)

The imaging device of (1), wherein the first floating diffusion is between the vertical transistor of the first pixel and the vertical transistor of the second pixel in a cross section view.

(3)

The imaging device of (1) or (2), wherein the second photoelectric conversion region of the first pixel is disposed below the first photoelectric conversion region of the first pixel, and the second photoelectric conversion region of the second pixel is disposed below the first photoelectric conversion region of the second pixel.

(4)

The imaging device of any of (1) to (3), further comprising:
a third pixel, including:
a third photoelectric conversion film region;
a first photoelectric conversion region, wherein the first photoelectric conversion region is formed in the substrate;
a second photoelectric conversion region, wherein the second photoelectric conversion region is formed in the substrate;
a vertical transistor for the first photoelectric conversion region;
a second floating diffusion, wherein the second floating diffusion is between the second region of the second photoelectric conversion film of the second pixel and the third region of the second photoelectric conversion film of the third pixel, and wherein the second floating diffusion stores charges from the second region of the second photoelectric conversion film of the second pixel and the third region of the second photoelectric conversion film of the third pixel.

(5)

The imaging device of (4), wherein a portion of the first photoelectric conversion region of the third pixel is formed between a light incident surface of the substrate and the vertical transistor for the first photoelectric conversion region of the third pixel.

(6)

The imaging device of (4) or (5), further comprising:
a fourth pixel, including:
a fourth photoelectric conversion film region;
a first photoelectric conversion region, wherein the first photoelectric conversion region is formed in the substrate;
a second photoelectric conversion region, wherein the second photoelectric conversion region is formed in the substrate;
a vertical transistor for the first photoelectric conversion region;
a fifth pixel, including:
a fifth photoelectric conversion film region;
a first photoelectric conversion region, wherein the first photoelectric conversion region is formed in the substrate;
a second photoelectric conversion region, wherein the second photoelectric conversion region is formed in the substrate;
wherein the first floating diffusion additionally stores charges from the fourth region of the first photoelectric conversion film of the fourth pixel and the fifth region of the first photoelectric conversion film of the fifth pixel.

(7)

The imaging device of (6), wherein a portion of the first photoelectric conversion region of the third pixel is formed between a light incident surface of the substrate and the vertical transistor for the first photoelectric conversion region of the third pixel, wherein a portion of the first photoelectric conversion region of the fourth pixel is formed between a light incident surface of the substrate and the vertical transistor for the first photoelectric conversion region of the fourth pixel, and wherein a portion of the first photoelectric conversion region of the fifth pixel is formed between a light incident surface of the substrate and the vertical transistor for the first photoelectric conversion region of the fifth pixel.

(8)
The imaging device of (6) or (7), further comprising:
a sixth pixel, including:
a sixth photoelectric conversion film region;
a first photoelectric conversion region, wherein the first photoelectric conversion region is formed in the substrate;
a second photoelectric conversion region, wherein the second photoelectric conversion region is formed in the substrate;
wherein the second floating diffusion is additionally shared by the fifth region of the second photoelectric conversion film of the fifth pixel and the sixth region of the second photoelectric conversion film of the sixth pixel.

(9)
The imaging device of (8), wherein a portion of the first photoelectric conversion region of the third pixel is formed between a light incident surface of the substrate and the vertical transistor for the first photoelectric conversion region of the third pixel, wherein a portion of the first photoelectric conversion region of the fourth pixel is formed between a light incident surface of the substrate and the vertical transistor for the first photoelectric conversion region of the fourth pixel, wherein a portion of the first photoelectric conversion region of the fifth pixel is formed between a light incident surface of the substrate and the vertical transistor for the first photoelectric conversion region of the fifth pixel wherein a portion of the first photoelectric conversion region of the sixth pixel is formed between a light incident surface of the substrate and the vertical transistor for the first photoelectric conversion region of the sixth pixel.

(10)
The imaging device of (8) or (9), wherein the first floating diffusion is in a region between the vertical transistors of the first, second, fourth, and fifth pixels in a plan view.

(11)
The imaging device of (10), wherein the second floating diffusion is in a region between the second photoelectric conversion regions of the second, third, fifth, and sixth pixels in a plan view.

(12)
The imaging device of (11), wherein the first floating diffusion and the second floating diffusion are disposed along a line that extends between the second pixel and the fifth pixel.

(13)
The imaging device of (12), further comprising a plurality of transistors, wherein each of the first, second, third, fourth, fifth, and sixth pixels includes at least one of the transistors for a corresponding one of the second photoelectric conversion regions.

(14)
The imaging device of (13), wherein the transistors are at least partially formed on a surface of the substrate that is opposite a light incident surface of the substrate.

(15)
The imaging device of (8), wherein the first floating diffusion is coupled to the second floating diffusion by a wiring.

(16)
The imaging device of (15), wherein the wiring is disposed between the second pixel and the fifth pixel in a plan view.

(17)
The imaging device of (16), wherein the photoelectric conversion film is sensitive to a green component of incident light.

(18)
The imaging device of any of (1) to (17), wherein each of the first photoelectric conversion regions is between one of the second photoelectric conversion regions and one of the photoelectric conversion film regions.

(19)
The imaging device of any of (1) to (18), further comprising: a first through electrode, wherein the first through electrode extends from a first side of the substrate to a second side of the substrate.

(20)
The imaging device of (19), wherein the first through electrode is connected to a bottom electrode disposed on a side of the photoelectric conversion film.

(21)
An electronic apparatus, comprising:
an imaging device, including:
a substrate;
a photoelectric conversion film disposed above the substrate;
a first pixel, including:
a first photoelectric conversion film region;
a first photoelectric conversion region, wherein the first photoelectric conversion region is formed in the substrate;
a second photoelectric conversion region, wherein the second photoelectric conversion region is formed in the substrate;
a vertical transistor for the first photoelectric conversion element;
a second pixel, including:
a second photoelectric conversion film region;
a first photoelectric conversion region, wherein the first photoelectric conversion region is formed in the substrate;
a second photoelectric conversion region, wherein the second photoelectric conversion region is formed in the substrate;
a vertical transistor for the first photoelectric conversion region;
a first floating diffusion, wherein a portion of the first photoelectric conversion region of the first pixel is formed between a light incident surface of the substrate and the vertical transistor for the first photoelectric conversion region of the first pixel, wherein a portion of the second region of the first photoelectric conversion film of the second pixel is formed between the light incident surface of the substrate and the second vertical transistor of the second pixel, and wherein the first floating diffusion stores charges from the first and second regions of the first photoelectric conversion film of the first and second pixels; and
a controller, wherein the controller controls operation of the imaging device.

(1a)
A solid-state imaging element of a vertical spectral type formed by laminating a plurality of photoelectric conversion portions with different wavelengths of light for photoelectric conversion in each pixel region, the solid-state imaging element including:
a first photoelectric conversion portion that is formed in each pixel region and performs photoelectric conversion according to a first wavelength of incident light;
a first reading portion that is formed in each pixel region and reads charges converted by the first photoelectric conversion portion; and
a first storage unit that is formed between adjacent pixels and stores the charges read by the first reading portion formed in each of the plurality of adjacent pixels.

(2a)

The solid-state imaging element according to (1a), wherein the first reading portion is a vertical transistor.

(3a)

The solid-state imaging element according to (1a) or (2a), wherein the first reading portion is formed in each pixel region adjacent to the first storage unit formed between adjacent pixels.

(4a)

The solid-state imaging element according to any of (1a) to (3a), wherein the first storage unit is formed between two adjacent pixels, and stores the charges read by the first reading portion formed in each of the two adjacent pixels.

(5a)

The solid-state imaging element according to any of (1a) to (3a), wherein the first storage unit is formed between 2×2 adjacent pixels, and stores the charges read by the first reading portion formed in each of the 2×2 adjacent pixels.

(6a)

The solid-state imaging element according to any of (1a) to (5a), further including:

a second photoelectric conversion portion that is laminated on the first photoelectric conversion portion in each pixel region and performs photoelectric conversion according to a second wavelength different from the first wavelength of the incident light;

a second reading portion that is formed in each pixel region and reads charges converted by the second photoelectric conversion portion; and a second storage unit that is formed between adjacent pixels and stores the charges read by the second reading portion formed in each of the plurality of adjacent pixels.

(7a)

The solid-state imaging element according to (6a), wherein the second reading portion is a planar transistor.

(8a)

The solid-state imaging element according to (6a) or (7a), wherein the second reading portion is formed in each pixel region adjacent to the second storage unit formed between adjacent pixels.

(9a)

The solid-state imaging element according to any of (6a) to (8a), wherein the second storage unit is formed between two adjacent pixels and stores the charges read by the second reading portion formed in each of the two adjacent pixels.

(10a)

The solid-state imaging element according to any of (6a) to (8a), wherein the second storage unit is formed between 2×2 adjacent pixels and stores the charges read by the second reading portion formed in each of the 2×2 adjacent pixels.

(11a)

The solid-state imaging element according to any of (6a) to (10a), wherein the first storage unit and the second storage unit are connected by a wiring.

(12a)

The solid-state imaging element according to any of (6a) to (11a), further including:

a third photoelectric conversion portion that is laminated on the first and second photoelectric conversion portions in each pixel region and performs photoelectric conversion according to a third wavelength different from the first and second wavelengths of the incident light;

a third reading portion that is formed in each pixel region and reads charges converted by the third photoelectric conversion portion; and a third storage unit that is formed between adjacent pixels and stores the charges read by the third reading portion.

(13a)

The solid-state imaging element according to any of (6a) to (11a), wherein the third reading portion is a through-electrode.

(14a)

The solid-state imaging element according to (12a) or (13a), wherein the third reading portion is formed in each pixel region adjacent to the third storage unit formed between adjacent pixels.

(15a)

The solid-state imaging element according to any of (12a) to (14a), wherein the third storage unit is formed between two adjacent pixels and stores the charges read by the third reading portion formed in each of the two adjacent pixels.

(16a)

The solid-state imaging element according to (12a) to (14a), wherein the third storage unit is formed between 2×2 adjacent pixels and stores the charges read by the third reading portion formed in each of the 2×2 adjacent pixels.

(17a)

An electronic device mounted with a solid-state imaging element of a vertical spectral type formed by laminating a plurality of photoelectric conversion portions with different wavelengths of light for photoelectric conversion in each pixel region, the solid-state imaging element including:

a first photoelectric conversion portion that is formed in each pixel region and performs photoelectric conversion according to a first wavelength of incident light;

a first reading portion that is formed in each pixel region and reads charges converted by the first photoelectric conversion portion; and a first storage unit that is formed between adjacent pixels and stores the charges read by the first reading portion formed in each of the plurality of adjacent pixels.

In addition, embodiments of the present disclosure are not limited to the above-described embodiments, and various alterations may occur insofar as they are within the scope of the present disclosure.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 20 solid-state imaging element
21 Si substrate
22 photoelectric conversion film (G)
25 through-electrode
26 FD
27 PD (B)
28 vertical Tr
29 FD
30 PD (R)
31 planar Tr
32 FD
33 on-chip lens
50, 60 solid-state imaging element
61 wiring
71 wiring layer

What is claimed is:

1. A solid-state imaging device, comprising:
a substrate; and
a plurality of pixel regions, wherein each pixel region of the plurality of pixel regions includes:
 a first photoelectric conversion portion that performs photoelectric conversion according to a first wavelength of incident light;
 a first reading portion that reads charges converted by the first photoelectric conversion portion;
 a first storage unit that is formed between adjacent pixels and stores the charges read by the first reading portion;
 a second photoelectric conversion portion that performs photoelectric conversion according to a second wavelength different from the first wavelength of the incident light;
 a second reading portion that reads charges converted by the second photoelectric conversion portion;
 a second storage unit that is formed between adjacent pixels and stores the charges read by the second reading portion; and
 a wiring connecting the first storage unit and the second storage unit.

2. The solid-state imaging device of claim 1, wherein the first reading portion is a vertical transistor.

3. The solid-state imaging device of claim 1, wherein the first reading portion is formed adjacent to the first storage unit formed between the adjacent pixels.

4. The solid-state imaging device of claim 1, wherein the first storage unit is formed between two adjacent pixels, and stores the charges read by the first reading portion formed in each of the two adjacent pixels.

5. The solid-state imaging device of claim 1, wherein the first storage unit is formed between 2×2 adjacent pixels, and stores the charges read by the first reading portion formed in each of the 2×2 adjacent pixels.

6. The solid-state imaging device of claim 1, wherein the second reading portion is a planar transistor.

7. The solid-state imaging device of claim 1, wherein the second reading portion is formed adjacent to the second storage unit formed between adjacent pixels.

8. The solid-state imaging device of claim 1, wherein the second storage unit is formed between two adjacent pixels, and stores the charges read by the second reading portion formed in each of the two adjacent pixels.

9. The solid-state imaging device of claim 1, wherein the second storage unit is formed between 2×2 adjacent pixels, and stores the charges read by the second reading portion formed in each of the 2×2 adjacent pixels.

10. The solid-state imaging device of claim 1, wherein each pixel region of the plurality of pixel regions further includes:
 a third photoelectric conversion portion that performs photoelectric conversion according to a third wavelength different from the first and second wavelengths of the incident light;
 a third reading portion that reads charges converted by the third photoelectric conversion portion; and
 a third storage unit that is formed between adjacent pixels and stores the charges read by the third reading portion.

11. The solid-state imaging device of claim 10, wherein the third reading portion is a through-electrode.

12. An electronic apparatus, the electronic apparatus comprising:
a solid-state imaging device, comprising:
 a substrate; and
 a plurality of pixel regions, wherein each pixel region of the plurality of pixel regions includes:
  a first photoelectric conversion portion that performs photoelectric conversion according to a first wavelength of incident light;
  a first reading portion that reads charges converted by the first photoelectric conversion portion;
  a first storage unit that stores the charges read by the first reading portion formed in each of a plurality of adjacent pixels;
  a second photoelectric conversion portion that performs photoelectric conversion according to a second wavelength different from the first wavelength of the incident light;
  a second reading portion that reads charges converted by the second photoelectric conversion portion;
  a second storage unit that stores the charges read by the second reading portion formed in each of the plurality of adjacent pixels; and
  a wiring connecting the first storage unit and the second storage unit.

13. The electronic apparatus of claim 12, wherein the first reading portion is a vertical transistor.

14. The electronic apparatus of claim 12, wherein the first reading portion is formed adjacent to the first storage unit formed between adjacent pixels.

15. The electronic apparatus of claim 12, wherein the first storage unit is formed between two adjacent pixels, and stores the charges read by the first reading portion formed in each of the two adjacent pixels.

16. The electronic apparatus of claim 12, wherein the first storage unit is formed between 2×2 adjacent pixels, and stores the charges read by the first reading portion formed in each of the 2×2 adjacent pixels.

17. The electronic apparatus of claim 12, wherein the second reading portion is a planar transistor.

18. The electronic apparatus of claim 12, wherein each pixel region of the plurality of pixel regions further includes:
 a third photoelectric conversion portion that performs photoelectric conversion according to a third wavelength different from the first and second wavelengths of the incident light;
 a third reading portion that reads charges converted by the third photoelectric conversion portion; and
 a third storage unit that is formed between adjacent pixels and stores the charges read by the third reading portion.

19. The electronic apparatus of claim 18, wherein the third reading portion is a through-electrode.

* * * * *